United States Patent [19]

Miyamoto

[11] Patent Number: 5,111,433
[45] Date of Patent: May 5, 1992

[54] SEMICONDUCTOR MEMORY DEVICE WITH INHIBITING TEST MODE CANCELLATION AND OPERATING METHOD THEREOF

[75] Inventor: Hiroshi Miyamoto, Hyogo, Japan

[73] Assignee: Mitsubishi Denki Kabushiki Kaisha, Tokyo, Japan

[21] Appl. No.: 515,501

[22] Filed: Apr. 27, 1990

[30] Foreign Application Priority Data

May 8, 1989 [JP]  Japan ................... 1-114529

[51] Int. Cl.⁵ .............................. G11C 7/00
[52] U.S. Cl. ..................... 365/201; 365/195; 365/222; 365/233
[58] Field of Search ............ 365/200, 201, 222, 233, 365/193, 194, 195; 371/21.1, 21.4

[56] References Cited

U.S. PATENT DOCUMENTS

| | | | |
|---|---|---|---|
| 4,347,589 | 8/1982 | Proebsting | 365/222 |
| 4,507,761 | 3/1985 | Graham | 365/233 |
| 4,547,867 | 10/1985 | Reese et al. | 365/201 |
| 4,672,583 | 6/1987 | Nakaizumi | 365/222 |
| 4,686,456 | 8/1987 | Furuyama et al. | 324/73 R |
| 4,692,901 | 9/1987 | Kumanoya et al. | 365/201 |
| 4,758,992 | 7/1988 | Taguchi | 365/222 |
| 4,811,299 | 3/1989 | Miyazawa et al. | 365/201 |

FOREIGN PATENT DOCUMENTS

| | | |
|---|---|---|
| 61-292300 | 12/1986 | Japan . |
| 62-37480 | 8/1987 | Japan . |
| 62-250593 | 10/1987 | Japan . |
| 63-140499 | 6/1988 | Japan . |

OTHER PUBLICATIONS

Nikkei Micro Device, No. 1, 1987, p. 146, "4MDRAM".

Primary Examiner—Joseph A. Popek
Attorney, Agent, or Firm—Lowe, Price, LeBlanc & Becker

[57] ABSTRACT

A semiconductor memory device comprises a test mode reset inhibiting circuit (22). The test mode reset inhibiting circuit (22) comprises a trigger signal generating circuit (31). When the semiconductor memory device is set in hidden fresh mode during a test mode period, a trigger signal (REFCT) is generated from the trigger signal generating circuit (31). As long as the trigger signal (REFCT) is generated, test mode reset is inhibited by the test mode reset inhibiting circuit (22).

17 Claims, 13 Drawing Sheets

20 : TIMING GENERATING CIRCUIT

22 : TEST MODE RESET PROHIBITING CIRCUIT

TEST MODE SET CYCLE

TEST MODE RESET CYCLE

SEMICONDUCTOR MEMORY DEVICE WITH INHIBITING TEST MODE CANCELLATION AND OPERATING METHOD THEREOF

FIELD OF THE INVENTION

The present invention generally relates to semiconductor memory devices and an operating method thereof, and more particularly, to a semiconductor memory device which can be set in test mode and a test mode setting method thereof.

DESCRIPTION OF THE BACKGROUND ART

As a result of recent development in high integration of semiconductor memory devices, a dynamic random access memory (referred to as dynamic RAM hereinafter) with a large storage capacity of, for example, 4M bits has been developed. It takes more and more time for such a dynamic RAM to be tested, as the storage capacity increases. Therefore, a dynamic RAM with a self-contained testing circuit has been developed. When such a dynamic RAM with a self-contained testing circuit is set in test mode, some identical information is simultaneously written in a plurality of bits and other information stored in a plurality of bits is simultaneously read out.

FIG. 9 is a block diagram showing a structure of a conventional dynamic RAM with a self-contained testing circuit. This dynamic RAM is disclosed in Japanese Patent Laying-Open No. S.62-250593.

Referring to FIG. 9, in a memory cell array 1, a plurality of word lines and a plurality of bit line pairs are arranged to intersect each other, at which intersections memory cells are provided. In FIG. 9, there are typically shown two word lines WL1 and WL2, one bit line pair BL and $\overline{BL}$, a memory cell MC1 provided at the intersection of the word line WL1 and the bit line BL, and a memory cell MC2 provided at the intersection of the word line WL2 and the bit line $\overline{BL}$. A row address buffer 2 receives external address signals A0 through An and generates internal row address signals aX0 through aXn. A column address buffer 3 receives the external address signals A0 through An and generates internal column address signals aY0 through aYn.

A row decoder 4 receives the internal row address signals aX0 through aXn-1 and selects one of the plurality of word lines according to a combination of the signals. In reading operation, pieces of information in the memory cells connected to the selected word line are each read out to the corresponding bit line pair. This results in slight electric potential differences on the respective bit line pairs. A sense amplifier 5 amplifies the slight electric potential differences on the respective bit line pairs. A column decoder 6 receives the internal column address signals aY0 through aYn-1 and selects four bit line pairs out of the plurality of bit line pairs at a time according to a combination of the signals to connect them to bus line pairs I/00 through I/03, respectively.

The four bus line pairs I/00 through I/03 are connected to a data out buffer 8 through the pre-amplifiers 7a through 7d respectively. The four bus line pairs I/00 through I/03 are also connected to a data in buffer 9. A decoder 10 receives the most significant bit of the internal row address signals aXn and the most significant bit of the internal column address signals aYn. In reading operation, the decoder 10 selects one of the output signals given by the pre-amplifiers 7a through 7d to the data out buffer 8 and applies the same to an external output terminal 11 as output data $D_{OUT}$. While in writing operation, the decoder 10 selects one of the four bus line pairs I/00 through I/03 according to a combination of the internal address signals aXn and aYn to get the same to transmit input data $D_{IN}$ from an external input terminal 12.

A timing generating circuit 13 is responsive to a row address strobe signal $\overline{RAS}$, a column address strobe signal $\overline{CAS}$ and a write enable signal $\overline{WE}$ all of which are externally applied, for generating a test mode set signal $\overline{TS}$ and a test mode reset signal $\overline{TR}$ and other several control signals. A latch circuit 14 is responsive to the test mode set signal $\overline{TS}$ and the test mode reset signal $\overline{TR}$ for generating a test mode enable signal $\overline{TE}$. The test mode enable signal $\overline{TE}$ is enabled (turned to "L" level) during the test mode period. The data out buffer 8 and the data in buffer 9 are set in test mode when the test mode enable signal $\overline{TE}$ is enabled.

In FIG. 10, there is shown a structure of the data-in-buffer 9. The data-in-buffer 9 comprises four input selectors 9a through 9d. In the normal reading operation, one of the input selectors 9a through 9d is made available based on output of the decoder 10. As a result, input data $D_{IN}$ from the external input terminal 12 are transmitted to one of the four bus line paris I/00 through I/03. Meanwhile, the mode in which normal reading and writing operations are performed is here referred to as normal mode. In test mode, all of the input selectors 9a through 9d are made available by the test mode enable signal $\overline{TE}$. As a result, input data $D_{IN}$ from the external input terminal 12 are transmitted to the four bus line pairs I/00 through I/03 in parallel.

In FIG. 11, there is shown a structure of the data out buffer 8. The data out buffer 8 comprises four output selectors 8a through 8d and an output test selector 8e. One of the output selectors 8a through 8d is made available based on output of the decoder 10. As a result, one of the outputs of the four pre-amplifiers 7a through 7d is transmitted to the external output terminal 11 as output data $D_{OUT}$. In test mode, the test mode enable signal $\overline{TE}$ makes all the output selectors 8a through 8d unavailable and only the output test selector 8e available. As a result, the output test selector 8e comprises, for example, an excusive NOR (EXNOR) of the outputs of the four pre-amplifiers 7a through 7d, the result of which is transmitted to the external output terminal 11.

Now, operation of the dynamic RAM in FIG. 9 will be described. FIGS. 12A and 12B are timing charts for explaining operation of the dynamic RAM in normal mode. FIG. 12A is a timing chart for read cycle, while FIG. 12B is for write cycle.

In the read cycle, after the row address strobe signal $\overline{RAS}$ is turned down to the "L" level (active state), the column address strobe signal $\overline{CAS}$ is also turned down to the "L" (active state) while the write enable signal $\overline{WE}$ is held at the "H" level (non-active state). This allows the data read out of the selected memory cells in the memory dell array 1 to be outputted to the external output terminal 11 as output data $D_{OUT}$ through the bus line pairs I/00 through I/03, the pre-amplifiers 7a through 7d, and the data out buffer 8.

In the write cycle, after the row address strobe signal $\overline{RAS}$ is turned down to the "L" level, the write enable signal $\overline{WE}$ and the column address strobe signal $\overline{CAS}$ are both turned down to the "L" level. This allows the input data $D_{IN}$ applied to the external input terminal 12 to be written in the selected memory cells in the memory cell array 1 through the data in buffer 9 and the bus line pairs I/00 through I/03.

FIGS. 13A and 13B are timing charts for explaining operation of the dynamic RAM in test mode. FIG. 13A shows test mode set cycle, and FIG. 13B show test mode reset cycle.

In the test mode set cycle, the column address strobe signal $\overline{CAS}$ and the write enable signal $\overline{WE}$ are turned down to the "L" level before the row address strobe signal $\overline{RAS}$ is turned down to the "L" level. This enables the dynamic RAM to be set in test mode.

In the test mode reset cycle, the column address strobe signal $\overline{CAS}$ is turned down to the "L" level before the row address strobe signal $\overline{RAS}$ is turned down to the "L" level while the write enable signal $\overline{WE}$ is held at the "H" level. This releases the dynamic RAM from the test mode. In the test mode reset cycle, the row address strobe signal $\overline{RAS}$, the column address strobe signal $\overline{CAS}$ and the write enable signal $\overline{WE}$ are generated according to the so called $\overline{CAS}$ before $\overline{RAS}$ refresh timing. In other words, the dynamic RAM is released from test mode when operated according to the $\overline{CAS}$ before $\overline{RAS}$ refresh timing.

Generally, in the dynamic RAM, data stored in the respective memory cells are being lost due to leakage current with the lapse of time. In order to prevent this, it is necessary to regularly rewrite the data in the memory cells. This is referred to as "refresh". The above mentioned "$\overline{CAS}$ before $\overline{RAS}$ refresh" is one of the refresh methods.

FIG. 14 is a block diagram showing structure of a portion of the dynamic RAM in FIG. 9 which preforms the "$\overline{CAS}$ before $\overline{RAS}$ refresh".

The row address counter 2a generates address signals cX0 through cXn-1 for refresh. A $\overline{CAS}$ before $\overline{RAS}$ identifying circuit 2b receives the row address strobe signal $\overline{RAS}$ and the column address strobe signal $\overline{CAS}$ and, when they are received at the above described "$\overline{CAS}$ before $\overline{RAS}$" timing, activates a "$\overline{CAS}$ before $\overline{RAS}$" identifying signal CBR (referred to simply as identifying signal CBR hereinafter). The row address buffer 2 receives the external address signals A0 through An and the address signals cX0 through cXn-1 from the row address counter 2a. During the cycle in which the identifying signal CBR is non-active, the row address buffer 2 receives the external address signals A0 through An to generate them as internal row address signals aX0 through aXn while it does not accept the address signals cX0 through cXn-1 from the row address counter 2a. On the other hand, during the cycle where the identifying signal CBR is active, the row address buffer 2 receives the address signals cX0 through cXn-1 from the row address counter 2a to generate them as internal row address signals aX0 through aXn-1 while it does not accept the external address signals A0 through An. Generally, refresh operation is performed independently of the most significant bit of the row address signals so that the bit number of the address signals cX0 through cXn-1 outputted from the row address counter 2a is less than that of the external address signals A0 through An by one bit. During a refresh period, the most significant bit of the internal row address signals aXn is fixed at the "H" level or the "L" level by the row address buffer 2.

In refresh cycle, the row decoder 4 is responsive to the internal row address signals aX0 through aXn-1 for selecting one of the plurality of word lines in the memory cell array 1. As a result, data stored in the plurality of memory cells which are connected to the selected word line are each read out on the corresponding bit line pair. The electric potential differences on the respective bit line pairs are amplified by the sense amplifier 5. Thereafter, the data on the respective bit line pairs are again written in the corresponding memory cell each.

Generally, as another refresh method for a dynamic RAM, there is one called "hidden refresh" besides the above described "$\overline{CAS}$ before $\overline{RAS}$ refresh". FIG. 15 is a timing chart of the "hidden refresh" in a dynamic RAM.

In hidden refresh cycle, as in the read cycle, after the row address strobe signal $\overline{RAS}$ is turned down to the "L" level, the column address strobe signal $\overline{CAS}$ is turned down to the "L" level while the write enable signal $\overline{WE}$ is held at the "H" level. This allows the output data $D_{OUT}$ read out of the memory cell array 1 to appear on the external output terminal 11. Then, while the column address strobe signal $\overline{CAS}$ is held at the "L" level, the row address strobe signal $\overline{RAS}$ is raised to the "H" level and, after a predetermining time has passed, turned down to the "L" level again. As a result, refresh operation is performed while the output data $D_{OUT}$ remains held at the external output terminal 11.

As shown in FIG. 15, at the time t30 when the row address strobe signal $\overline{RAS}$ is turned down to the "L" level, the column address strobe signal $\overline{CAS}$ has been already turned down to the "L" level. Therefore, also in the hidden refresh cycle, as can be seen in the "$\overline{CAS}$ before $\overline{RAS}$ refresh"]cycle, the identifying signal CBR as shown in FIG. 14 is activated. As a result, a plurality of memory cells which has been selected based on the address signals cX0 through cXn-1 from the row address counter 2a are refreshed.

Methods for simultaneously testing a plurality of bits in a dynamic RAM are disclosed in the U.S. Pat. No. 4,692,901, Japanese Patent Laying-Open No. 61-292300, the U.S. Pat. No. 4,686,456 and so on. Furthermore, a detailed description of an output method for results in test mode is made in Japanese Patent Laying-Open No. S.63-140499.

Furthermore, methods for selecting function according to timing combination of clocks applied to a dynamic RAM is disclosed in the Japanese Patent Laying-Open No. 58-222500 and the U.S. Pat. No. 4,507,761. Among others, a test mode setting method according to timing combination of the row address strobe signal $\overline{RAS}$, the column address strobe signal $\overline{CAS}$ and the write enable signal $\overline{WE}$ is disclosed in the Japanese Patent Laying-Open No. 62-250593.

Meanwhile, for test mode reset method, for example, as disclosed in the separate volume of Nikkei Micro Device 1987, No.1, P. 146, the "$\overline{CAS}$ before $\overline{RAS}$ refresh" or the "$\overline{RAS}$ only refresh" is generally performed.

As described above, in the conventional dynamic RAM, test mode reset is performed in the "$\overline{CAS}$ before $\overline{RAS}$ refresh" cycle. As shown in FIG. 13B, the identifying signal CBR is activated in the "$\overline{CAS}$ before $\overline{RAS}$ refresh" cycle. Also in the "hidden refresh" cycle as shown in FIG. 15, the identifying signal CBR is activated. Therefore, if the "hidden refresh" cycle is performed in a test mode period, the test mode is to be reset based on the activated identifying signal CBR. This means that the "hidden refresh" cannot be performed while the test mode is maintained.

SUMMARY OF THE INVENTION

An object of the present invention is to make it possible to readily test a semiconductor memory device.

Another object of the present invention is to provide a semiconductor memory device which can operate in the other operation mode during a test mode period while holding the test mode.

Still another object of the present invention is to provide an operation method which makes it possible for a semiconductor memory device to operate in the other operation mode during a test mode period while holding the test mode.

Still another object of the present invention is to make it possible for a semiconductor memory device which is released from test mode at the "$\overline{CAS}$ before $\overline{RAS}$" timing to perform the "hidden refresh" operation while holding the test mode.

A semiconductor memory device according to the present invention can be set in a predetermined operation mode and test mode, and comprises a control device, a state hold device and a cancel inhibiting device. The control device is responsive to an externally applied control signal for setting the semiconductor memory device in a predetermined operation mode or test mode and releasing the same from the predetermined operation mode or test mode. The state hold device is responsive to the fact that the semiconductor memory device has been set in the predetermined operation mode for being set in a predetermined state, and further responsive to the fact that the semiconductor memory device has been released from the predetermined operation mode for being released from the predetermined state.

The inhibiting device inhibits cancellation of test mode by the control device while the state hold device above is set in the predetermined state.

In such a semiconductor memory device as described above, when it is set in a predetermined operation mode, the state hold device is also set in a predetermined state. As long as the state hold device is set in the predetermined state, cancellation of the test mode is inhibited by the cancel inhibiting device. Therefore, even if the semiconductor memory device is set in any other operation mode during a test mode period, the test mode cannot be cancelled.

An operating method of a semiconductor memory device according to another aspect of the present invention is for a semiconductor memory device which can be set in test mode and released from the same in response to the fact that it has identified an active state of the column address strobe signal at least at the moment when the row address strobe signal changes to an active state, and comprises the following steps. After the row address strobe signal is put in the active state in a test mode period, the column address strobe signal is put in the active state, which allows reading operation of the semiconductor memory device. While the column address strobe signal is held at the active state, the row address strobe signal is put in the non-active state and, after a predetermined time has passed, again put in the active state so that refresh operation is performed while maintaining the test mode.

In the above described operation method, even if "hidden refresh" is performed in a test mode period, the test mode cannot be cancelled.

DESCRIPTION OF THE PREFERRED EMBODIMENTS

With reference to the accompanying drawings of the embodiments according to the present invention, a detailed description will be made hereinafter.

Figure 1:
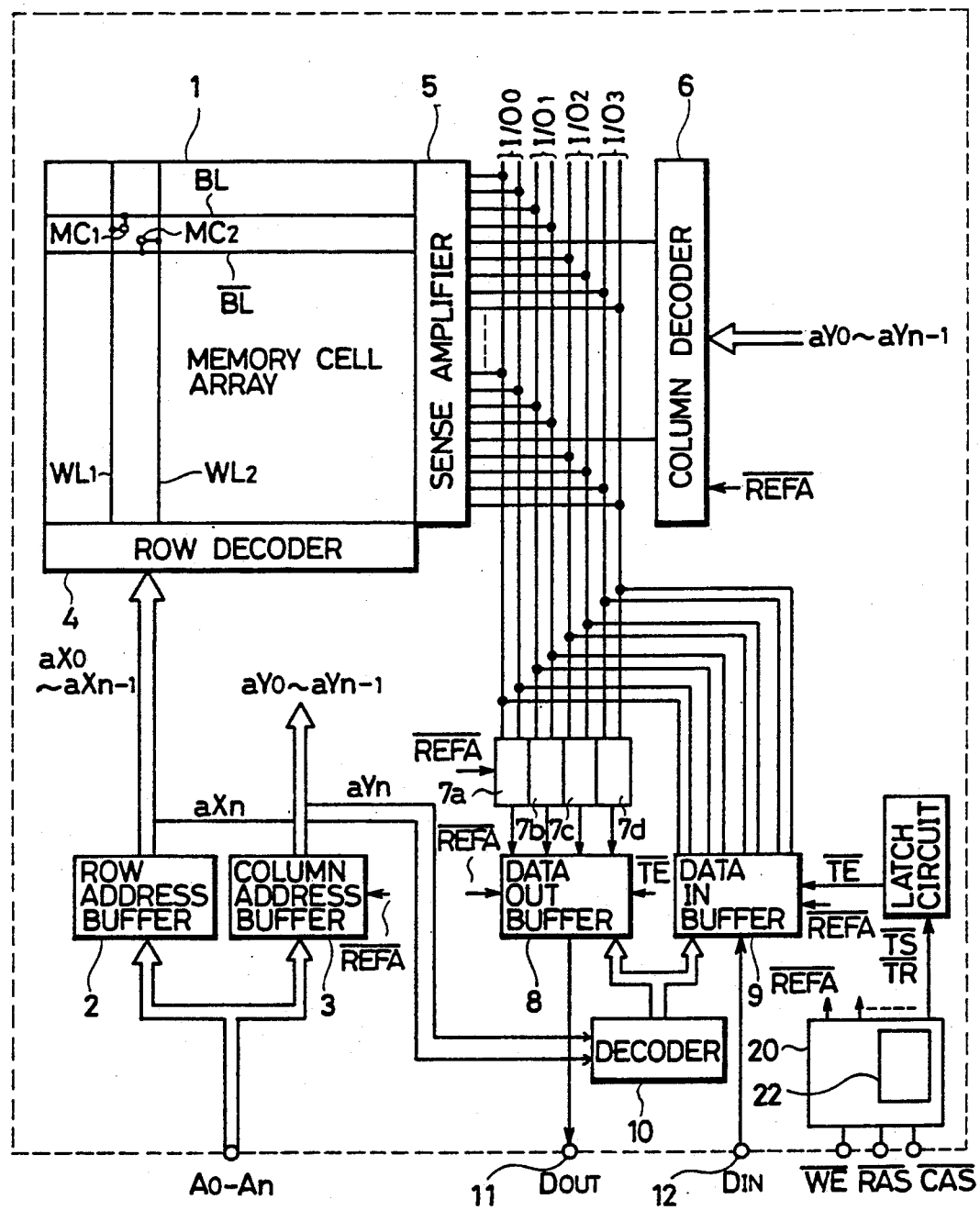
FIG. 1 is a block diagram showing an entire structure of a dynamic RAM according to an embodiment of the present invention.
Figure 9:
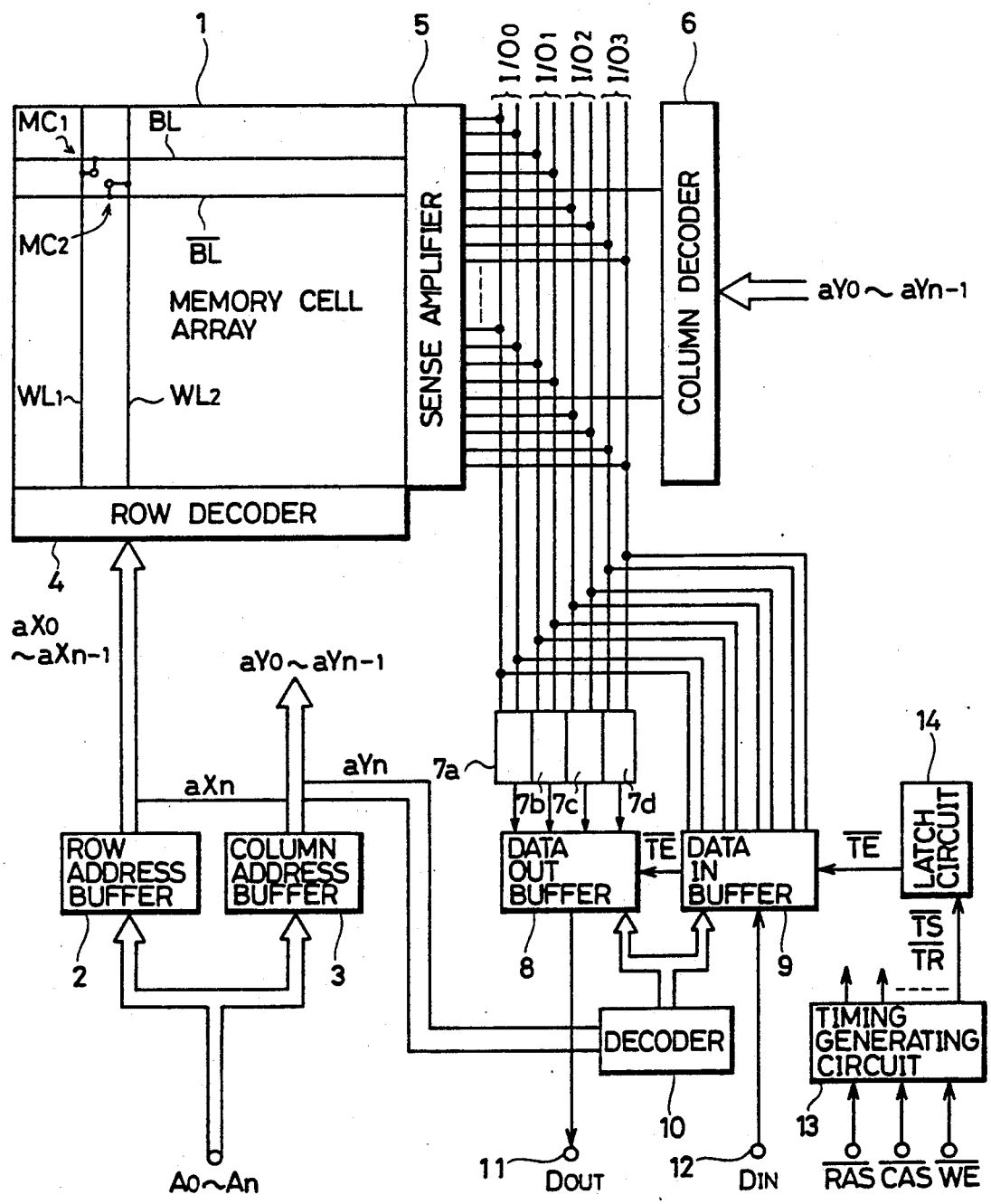
FIG. 9 is a block diagram showing an entire structure of a conventional dynamic RAM.
Figure 10:
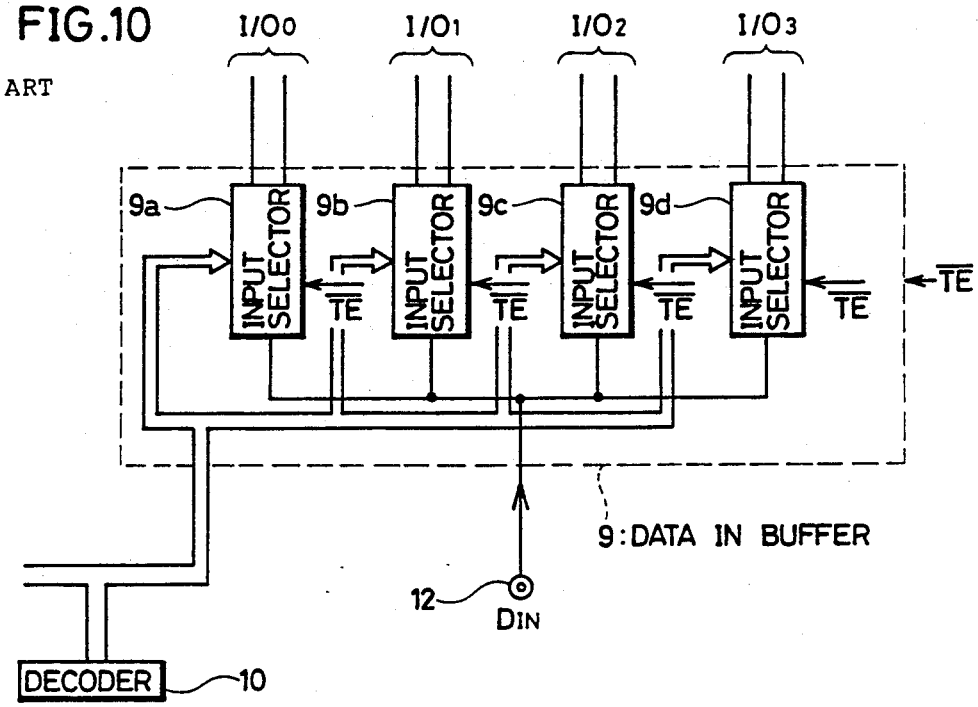
FIG. 10 is a block diagram showing a structure of a data in buffer comprised in the dynamic RAMs shown in FIGS. 1 and 9.
Figure 11:
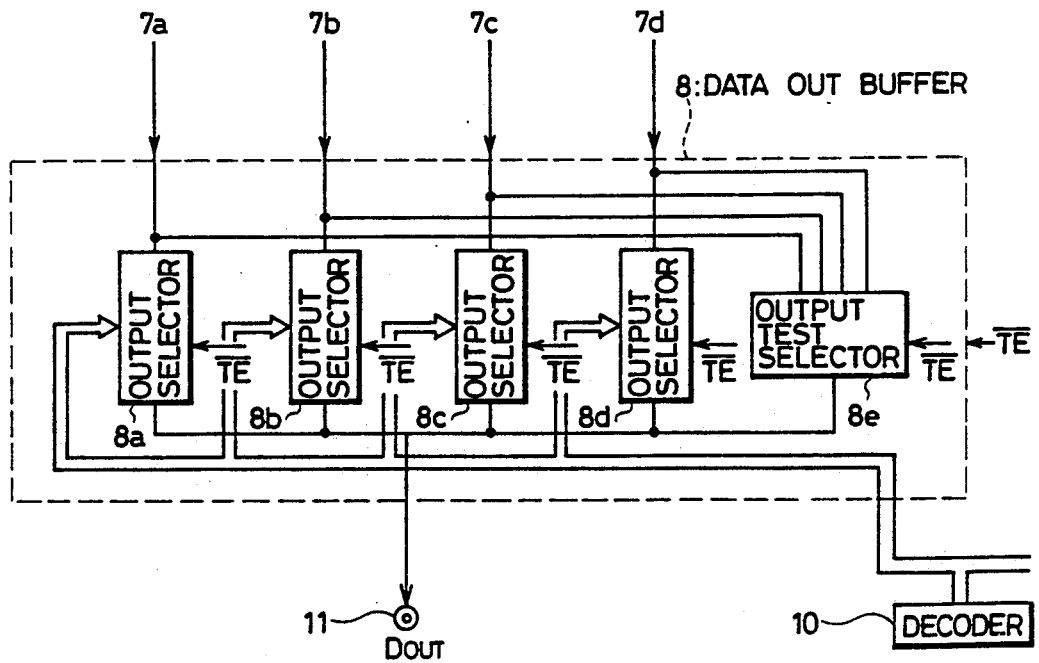
FIG. 11 is a block diagram showing a structure of a data out buffer comprised in the dynamic RAMs shown in FIGS. 1 and 9.
Figure 12A:
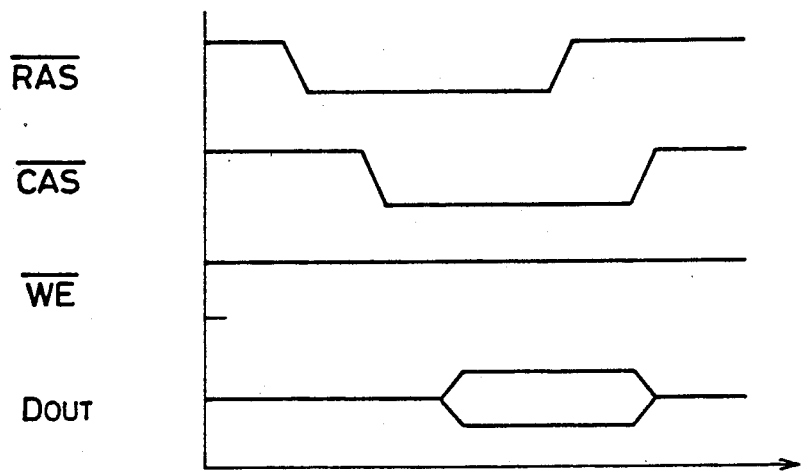
FIG. 12A is a timing chart for reading cycle in normal mode.
Figure 12B:
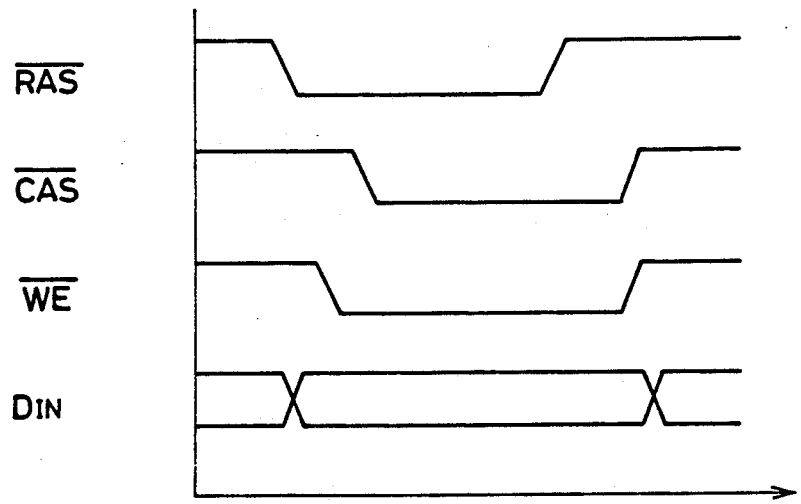
FIG. 12B is a timing chart for writing cycle in normal mode.
Figure 13A:
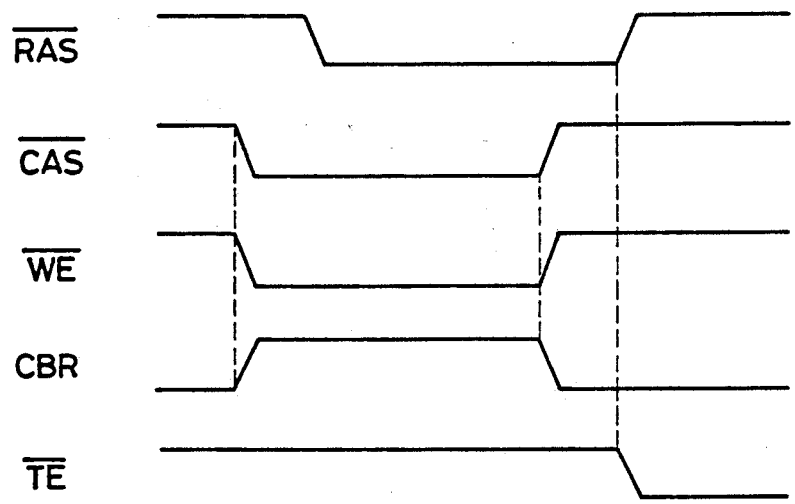
FIG. 13A is a timing chart for test mode set cycle.
Figure 13B:
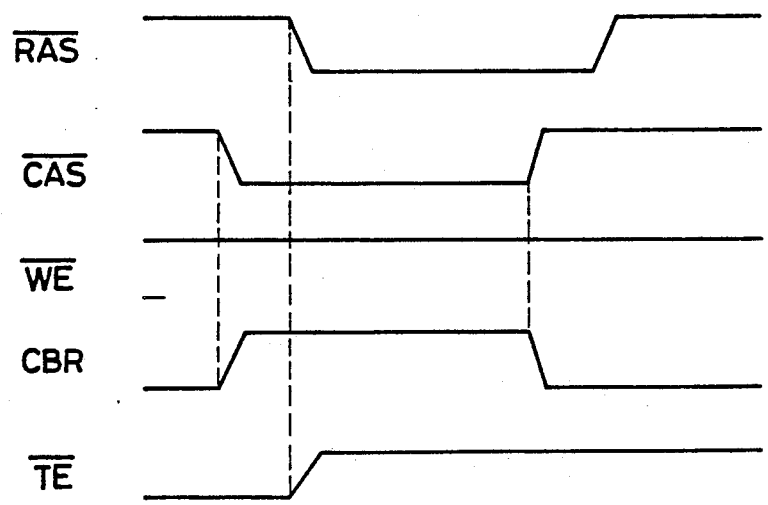
FIG. 13B is a timing chart for test mode reset cycle.

FIG. 1 is a block diagram showing an entire structure of a dynamic RAM according to an embodiment of the present invention. What is different in the dynamic RAM of FIG. 1 from a conventional one as shown in FIG. 9 is that a timing generating circuit 13 is replaced by another timing generating circuit 20.

Figure 2:
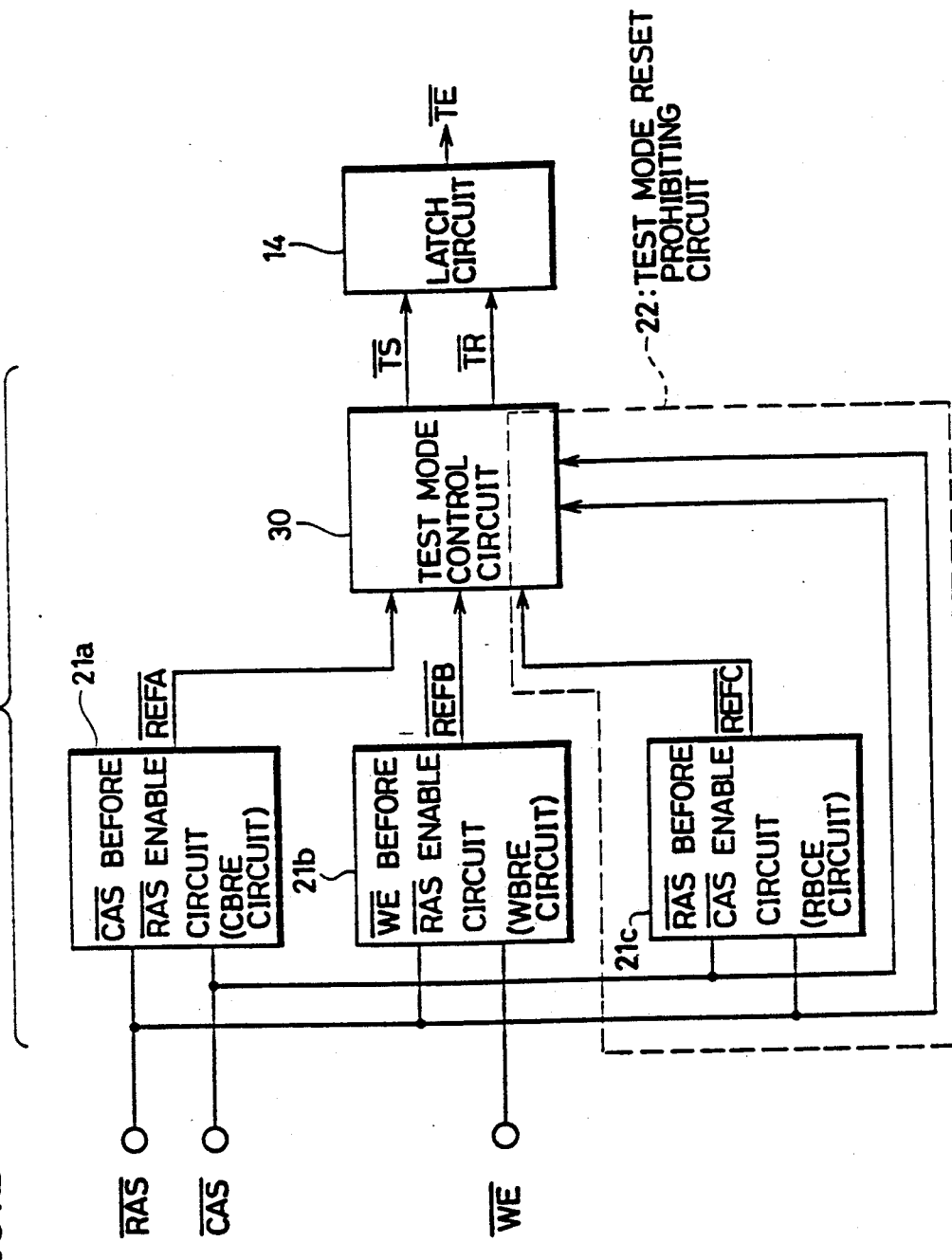
FIG. 2 is a block diagram showing a structure of a timing generating circuit comprised in the dynamic RAM of FIG. 1.

The timing generating circuit 20 comprises a test mode reset inhibiting circuit (referred to simply as inhibiting circuit hereinafter) 22. The timing generating circuit 20 comprises, as shown in FIG. 2, a "$\overline{CAS}$ before $\overline{RAS}$" enable circuit (referred to as CBRE circuit hereinafter) 21a, a "$\overline{WE}$ before $\overline{RAS}$" enable circuit (referred to as WBRE circuit hereinafter) 21b, a "$\overline{RAS}$ before $\overline{CAS}$" enable circuit (referred to as RBCE circuit hereinafter) 21c, and a test mode control circuit 30. The RBCE circuit 21c and a portion of the test mode control circuit 30 constitute the inhibiting circuit 22.

The CBRE circuit 21a is responsive to the row address strobe signal $\overline{RAS}$ and the column address strobe signal $\overline{CAS}$ for outputting a "$\overline{CAS}$ before $\overline{RAS}$" enable signal (referred to as CBR enable signal hereinafter) $\overline{\text{REFA}}$. The WBRE circuit 21b is responsive to the row address strobe signal $\overline{\text{RAS}}$ and the write enable signal $\overline{\text{WE}}$ for outputting a "$\overline{\text{WE}}$ before $\overline{\text{RAS}}$" enable signal (referred to as WBR enable signal hereinafter) $\overline{\text{REFB}}$. The RBCE circuit 21c is responsive to the row address strobe signal $\overline{\text{RAS}}$ and the column strobe signal $\overline{\text{CAS}}$ for outputting a "$\overline{\text{RAS}}$ before $\overline{\text{CAS}}$" enable signal (referred to as RBC enable signal hereinafter) $\overline{\text{REFC}}$.

The test mode control circuit 30 is responsive to the CBR enable signal $\overline{\text{REFA}}$, the WBR signal $\overline{\text{REFB}}$, and the RBC enable signal $\overline{\text{REFC}}$ for applying a test mode set signal $\overline{\text{TS}}$ and a test mode reset signal $\overline{\text{TR}}$ to a latch circuit 14.

Figure 3A:
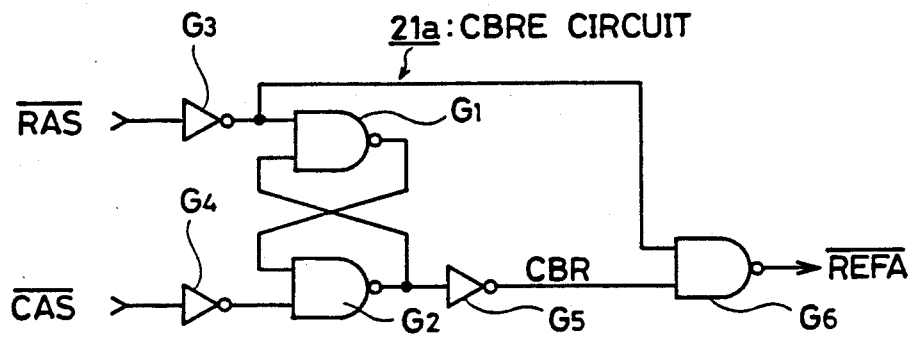
FIG. 3A is a logical circuit diagram showing a structure of a $\overline{CAS}$ before $\overline{RAS}$ enable circuit.
Figure 3B:
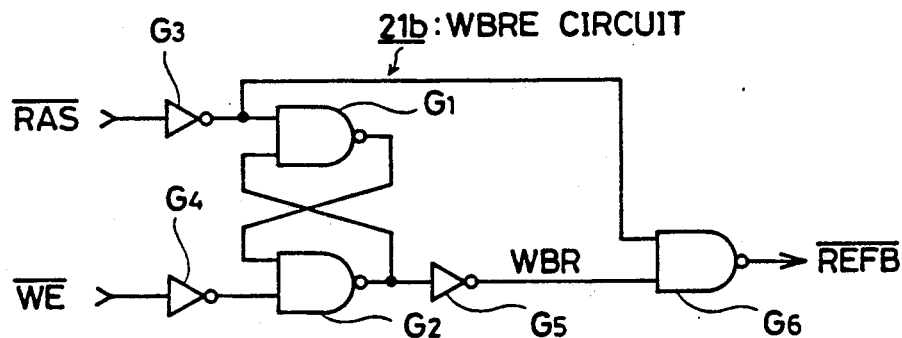
FIG. 3B is a logical circuit diagram showing a structure of a $\overline{WE}$ before $\overline{RAS}$ enable circuit.
Figure 3C:
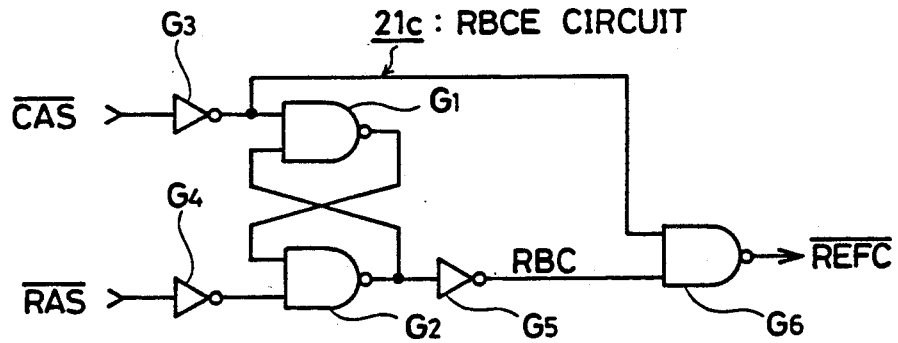
FIG. 3C is a logical circuit diagram showing a structure of a $\overline{RAS}$ before $\overline{CAS}$ enable circuit.

FIGS. 3A, 3B and 3C are circuit diagrams showing structures of the CBRE circuit 21a, the WBRE circuit 21b, and the RBCE circuit 21c, respectively. As shown in FIGS. 3A to 3C, each of the CBRE circuit 21a, WBRE circuit 21b, and RBCE circuit 21c comprises a latch circuit composed of NAND gates G1 and G2, inverters G3 to G5 and an NAND gate G6.

Figure 14:
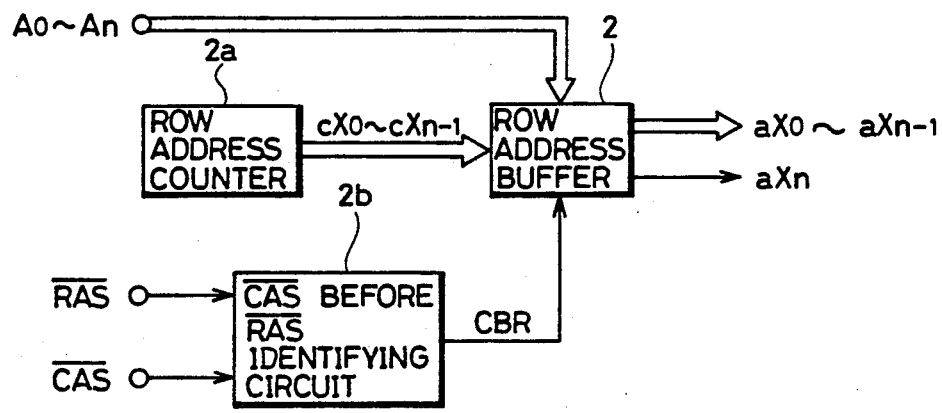
FIG. 14 is a block diagram showing structure of a row address buffer and its peripheral portions comprised in a conventional dynamic RAM.
Figure 15:
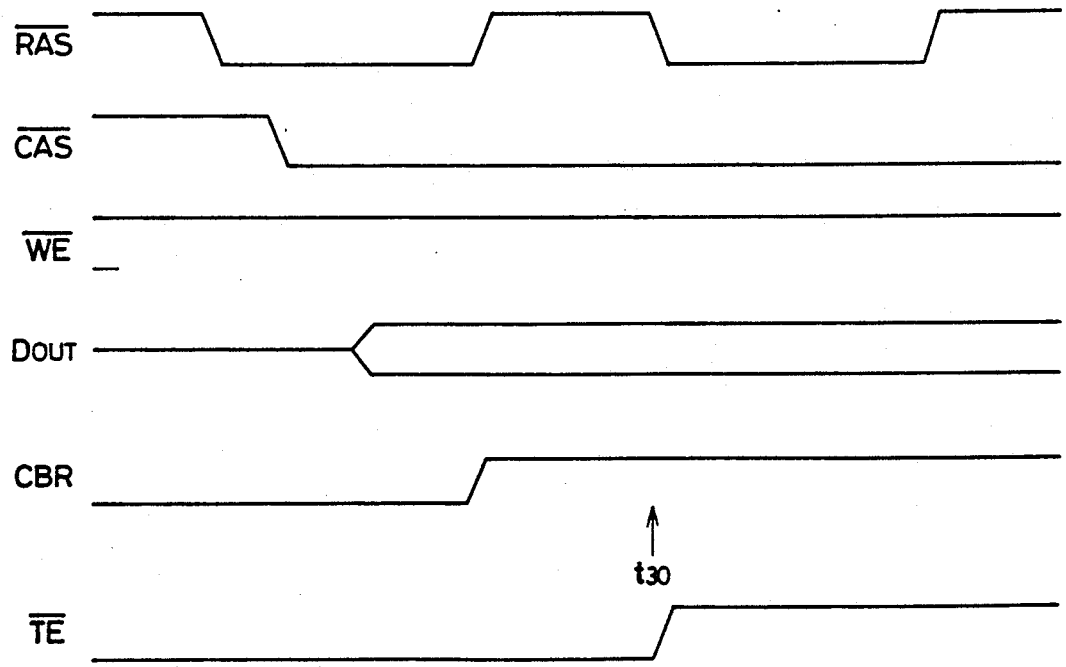
FIG. 15 is a timing chart for hidden refresh cycle.

The CBRE circuit 21a senses that the column address strobe signal $\overline{\text{CAS}}$ has been at the "L" level at the moment when the row address strobe signal $\overline{\text{RAS}}$ changes to the "L" level to enable the CBR enable signal $\overline{\text{REFA}}$. While the identifying signal CBR outputted from the identifying circuit 2b in FIG. 14 is enabled at the timing of falling of the column address strobe signal $\overline{\text{CAS}}$, the CBR enable signal $\overline{\text{REFA}}$ outputted from the CBRE circuit 21a shown in FIG. 3A is enabled at the timing of falling of the row address strobe signal $\overline{\text{RAS}}$. In this embodiment, the CBR enable signal $\overline{\text{REFA}}$ is applied to the row address buffer 2 instead of the identifying signal CBR shown in FIG. 14.

The WBRE circuit 21b senses that the write enable signal $\overline{\text{WE}}$ has been at the "L" level when the row address strobe signal $\overline{\text{RAS}}$ changes to the "L" level to enable the WBR enable signal $\overline{\text{REFB}}$. This WBR enable signal $\overline{\text{REFB}}$ is enabled at the timing of falling of the row address strobe signal $\overline{\text{RAS}}$.

The RBCE circuit 21c senses that the row address strobe signal $\overline{\text{RAS}}$ has been at the "L" level when the column address strobe signal $\overline{\text{CAS}}$ changes to the "L") level to enable the RBC enable signal $\overline{\text{REFC}}$. This RBC enable signal $\overline{\text{REFC}}$ is enabled at the timing of falling of the column address strobe signal $\overline{\text{CAS}}$.

The inverter G5 in the CBRE circuit 21a outputs a "$\overline{\text{CAS}}$ before $\overline{\text{RAS}}$" identifying signal CBR (referred to simply as identifying signal CBR hereinafter). The inverter G5 in the WBRE circuit 21b outputs a "$\overline{\text{WE}}$ before $\overline{\text{RAS}}$" identifying signal WBR (referred to simply as identifying signal WBR hereinafter). The inverter G5 in the RBCE circuit 21c outputs a "$\overline{\text{RAS}}$ before $\overline{\text{CAS}}$" identifying signal RBC (referred to simply as identifying signal RBC hereinafter).

Figure 4:
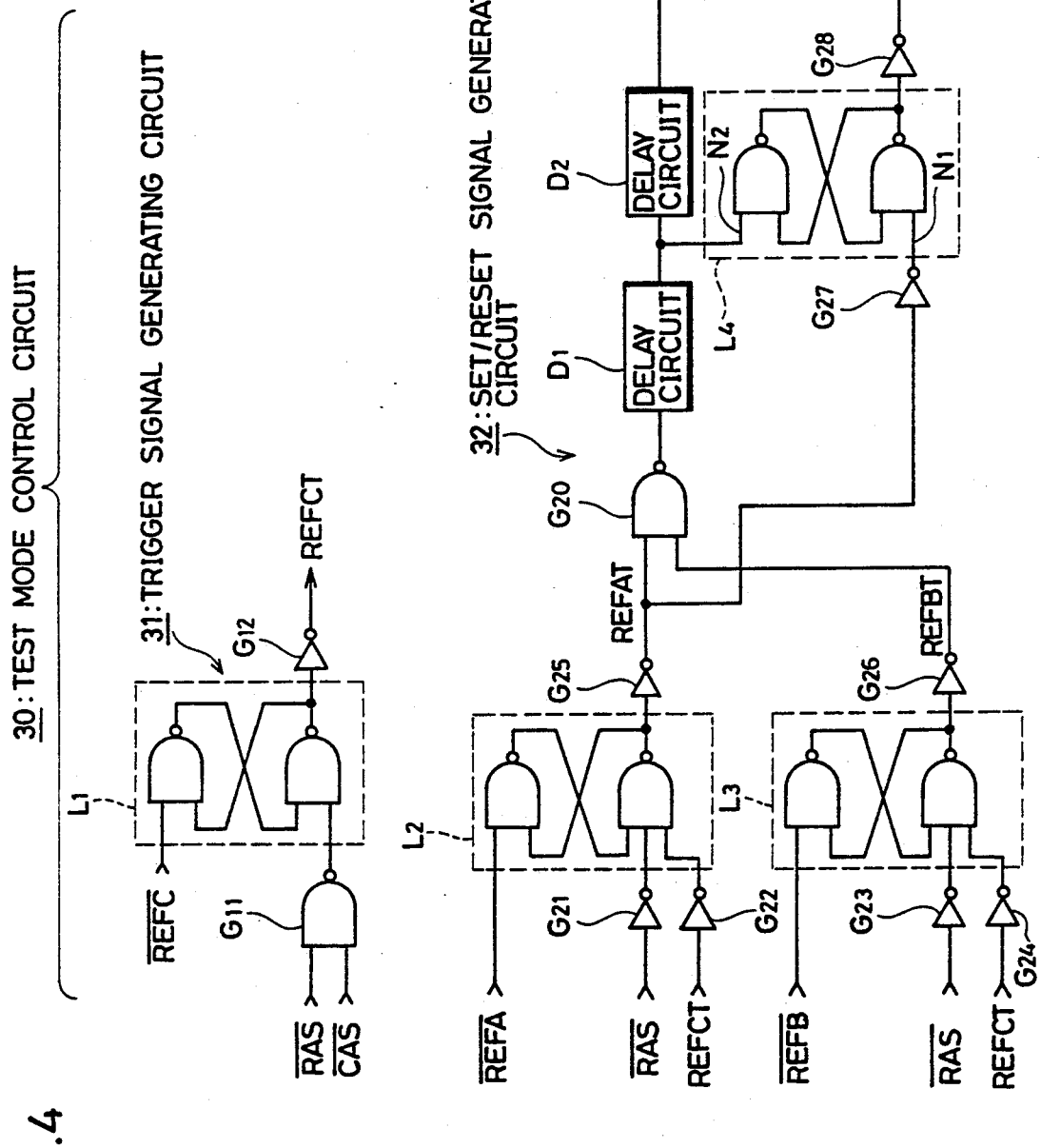
FIG. 4 is a logical circuit diagram showing a structure of a test mode control circuit.

FIG. 4 is a circuit diagram showing a structure of the test mode control circuit 30 shown in FIG. 2.

The test mode control circuit 30 comprises a "$\overline{\text{RAS}}$ before $\overline{\text{CAS}}$" trigger signal generating circuit (referred to as trigger signal generating circuit hereinafter) 31 and a set/reset signal generating circuit 32. The trigger signal generating circuit 31 comprises a latch circuit L1, an NAND gate G11 and an inverter G12. The latch circuit L1 is set when the RBC enable signal $\overline{\text{REFC}}$ is enabled, and reset when the row address strobe signal $\overline{\text{RAS}}$ and the column address strobe signal $\overline{\text{CAS}}$ both attain the "H" level. A "$\overline{\text{RAS}}$ before $\overline{\text{CAS}}$" trigger signal (referred to as RBC trigger signal hereinafter) REFCT is generated from the inverter G12.

The set/reset signal generating circuit 32 comprises three latch circuits L2 to L4, two delay circuits D1 and D2, and NAND gate G20 and inverters G21 to G28. The latch circuit L2 is set when the CBR enable signal $\overline{\text{REFA}}$ is enabled, and reset when the row address strobe signal $\overline{\text{RAS}}$ attains the "H" level or when the RBC trigger signal REFCT is enabled. A "$\overline{\text{CAS}}$ before $\overline{\text{RAS}}$" trigger signal (referred to as CBR trigger signal hereinafter) REFAT is generated from the inverter G25.

The latch circuit L3 is set when the WBR enable signal $\overline{\text{REFB}}$ is enabled, and reset when the row address strobe signal $\overline{\text{RAS}}$ attains the "H" level or when the RBC trigger signal REFCT is enabled. A "$\overline{\text{WE}}$ before $\overline{\text{RAS}}$ trigger signal (referred to as WBR trigger signal hereinafter) is generated from the inverter G26.

The latch circuit L4 is set by a delay signal of output from the NAND gate G20 when the CBR trigger signal REFAT and WBR trigger signal REFBT are both enabled. The test mode set signal $\overline{\text{TS}}$ is generated from the delay circuit D2 and the test mode reset signal $\overline{\text{TR}}$ is generated from the inverter G28.

When the latch circuit L4 is in the reset state, the test mode reset signal $\overline{\text{TR}}$ is enabled. On the other hand, when the latch circuit L4 is in the set state, the test mode set signal $\overline{\text{TS}}$ is enabled.

Figure 5:
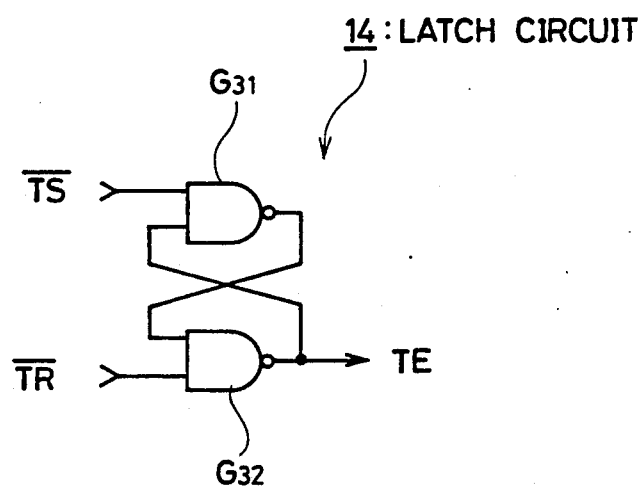
FIG. 5 is a logical circuit diagram showing a structure of a latch circuit.

FIG. 5 is a logical circuit diagram showing a structure of the latch circuit 14 shown in FIGS. 1 and 2. The latch circuit 14 comprises NAND gates G31 and G32. The latch circuit 14 is set when the test mode set signal $\overline{\text{TS}}$ is enabled, and reset when the test mode reset signal $\overline{\text{TR}}$ is enabled.

Figure 6:
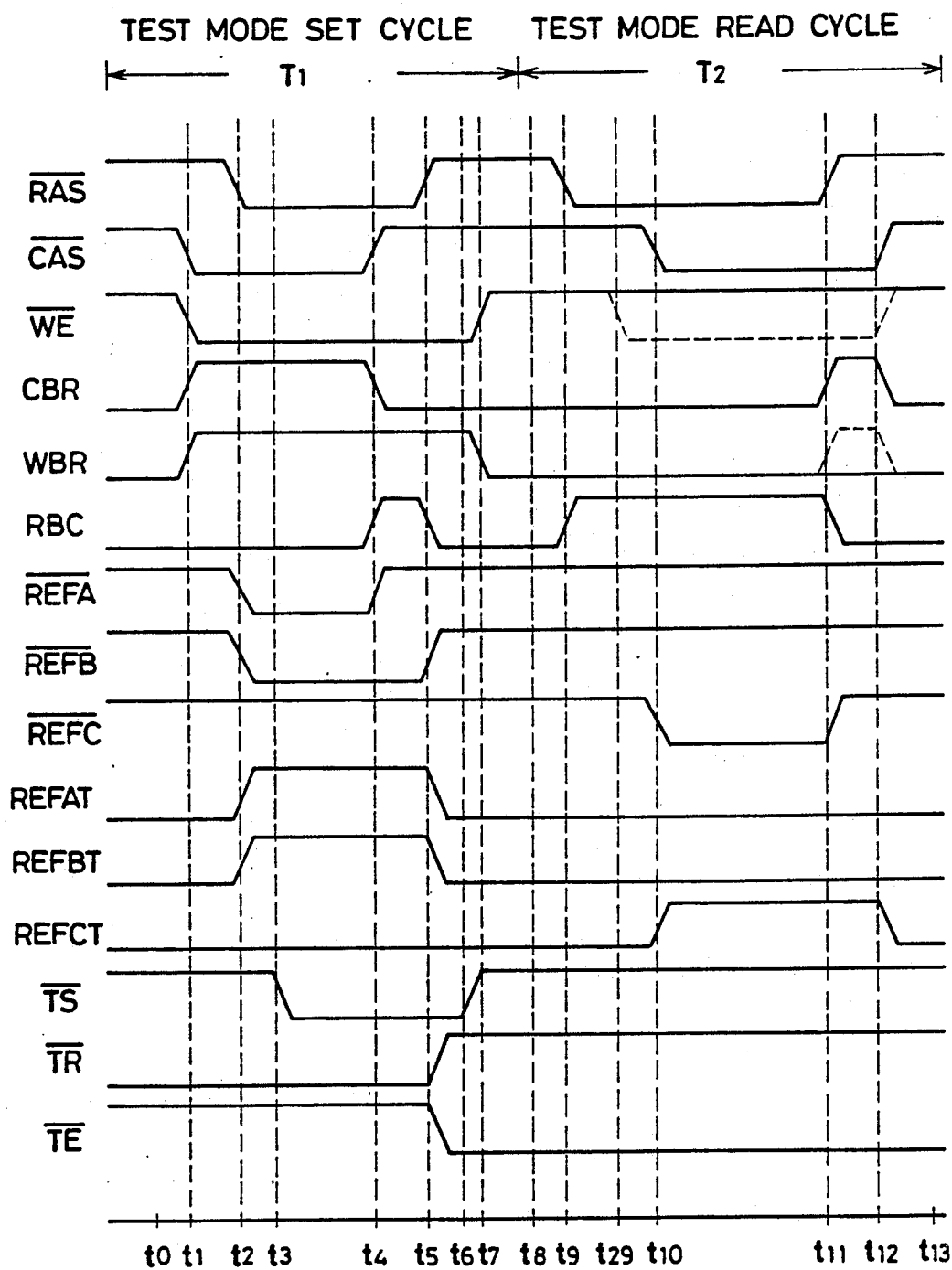
FIG. 6 is a timing chart for test mode set cycle and test mode read cycle of the dynamic RAM in FIG. 1.
Figure 7:
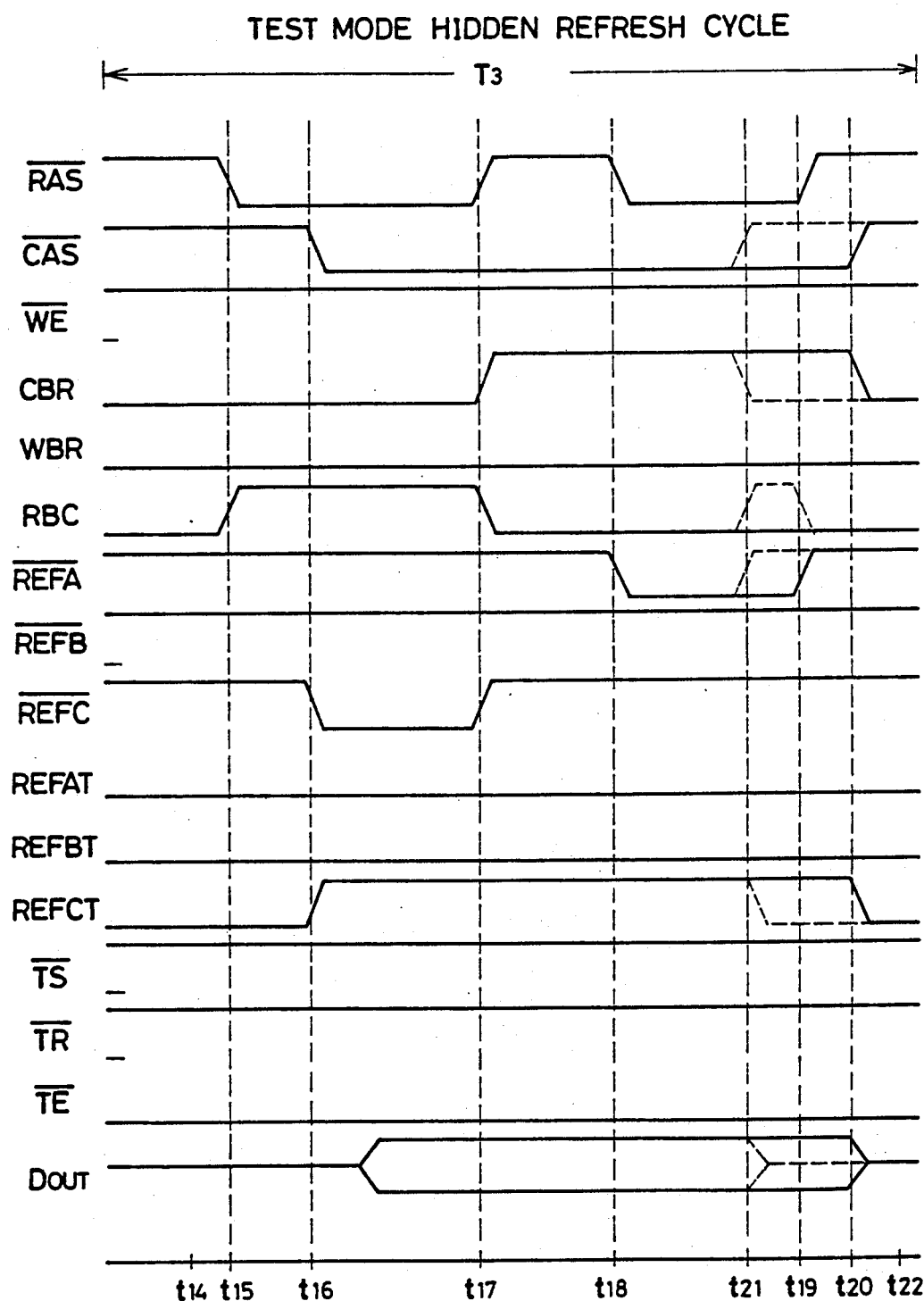
FIG. 7 is a timing chart for test mode hidden refresh cycle of the dynamic RAM in FIG. 1.
Figure 8:
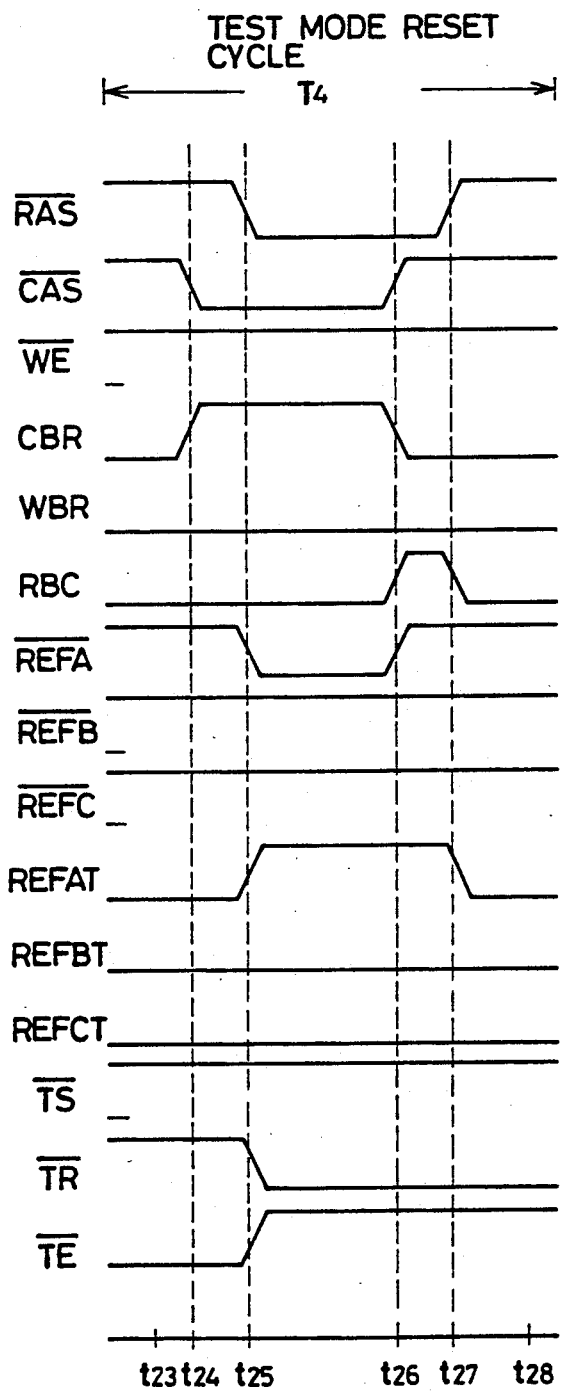
FIG. 8 is a timing chart for test mode reset cycle of the dynamic RAM in FIG. 1.

Now, referring to the operation waveforms in FIGS. 6 to 8, operation of the dynamic RAM shown in FIGS. 1 to 5 will be described. FIG. 6 shows test mode set cycle T1 and test mode read cycle T2. The test mode read cycle means a read cycle during a test mode period. FIG. 7 shows test mode hidden refresh cycle T3. The test mode hidden refresh cycle means a hidden refresh cycle during a test mode period. FIG. 8 shows test mode reset cycle T4.

(1) Test mode set cycle T1 (FIG. 6)

At the time t0, the row address strobe signal $\overline{\text{RAS}}$, the column address strobe signal $\overline{\text{CAS}}$ and the write enable signal $\overline{\text{WE}}$ are all at the "H" level. When the column address strobe signal $\overline{\text{CAS}}$ and the write enable signal $\overline{\text{WE}}$ falls to the "L" level at the time t1, the identifying signal CBR in the CBRE circuit 21a and the identifying signal WBR in the WBRE circuit 21b are both enabled.

When the row address strobe signal $\overline{\text{RAS}}$ falls to the "L" level at the time t2, the CBR enable signal $\overline{\text{REFA}}$ and the WBR enable signal $\overline{\text{REFB}}$ are both enabled since the identifying signal CBR and the identifying signal WBR have been enabled. Meanwhile, the identifying signal RBC has been disabled at the time t2 so that also the RBC enable signal $\overline{\text{REFC}}$ has been enabled. Therefore, the CBR trigger signal REFAT and the WBR trigger signal REFBT are both enabled by the latch circuits L2 and L3. As a result, the output of the NAND gate G20 is delayed by the delay circuits D1 and D2, which causes the test mode set signal $\overline{\text{TS}}$ to be enabled at the time t3. However, since the test mode reset signal $\overline{\text{TR}}$ has been enabled at the time t3, the test mode enable signal $\overline{\text{TE}}$ remains disabled.

Furthermore, when the column address strobe signal $\overline{\text{CAS}}$ attains the "H" level at the time t4, the identifying signal CBR is disabled. Therefore, the CBR enable signal $\overline{\text{REFA}}$ is disabled and the identifying signal RBC is enabled. When the row address strobe signal $\overline{\text{RAS}}$ attains the "H" level at the time t5, the identifying signal RBC is disabled and the WBR enable signal $\overline{\text{REFB}}$ is disabled. Therefore, the CBR trigger signal REFAT and the WBR trigger signal REFBT are disabled. The disabled CBR trigger signal REFAT causes input of the reset terminal N1 of the latch circuit L4 to be disabled. At this moment (t5), input of the set terminal N2 of the latch circuit L4 is held in its enabled state due to the delay caused by the delay circuit D1. As a result, the latch circuit L4 is set and the test mode reset signal $\overline{\text{TR}}$ is disabled. At this moment (t5), the test mode set signal $\overline{\text{TS}}$ remains set due to the delay caused by the delay circuits D1 and D2. Accordingly, the test mode enable signal $\overline{\text{TE}}$ is enabled by the latch circuit 14.

The output of the NAND gate G20 is delayed by the delay circuits D1 and D2 so that the test mode set signal $\overline{\text{TS}}$ is disabled at the time t6, but the test mode enable signal $\overline{\text{TE}}$ remains unchanged. When the write enable signal $\overline{\text{WE}}$ attains the "H" level at the time t7, the identifying signal WBR is disabled.

Through the above described operation, the dynamic RAM is set in test mode. In the operation above, the column address strobe signal $\overline{\text{CAS}}$ and the write enable signal $\overline{\text{WE}}$ are not necessarily required to simultaneously fall to the "L" level, but may fall to the "L" level at different timings. Additionally, the order in which the row address strobe signal $\overline{\text{RAS}}$, the column address strobe signal $\overline{\text{CAS}}$ and the write enable signal $\overline{\text{WE}}$ attain the "H" level will be optional.

(2) Test mode read cycle T2 (FIG. 6)

At the time t8, the row address strobe signal $\overline{\text{RAS}}$, the column address strobe signal $\overline{\text{CAS}}$ and the write enable signal $\overline{\text{WE}}$ are all at the "H") level. When the row address strobe signal $\overline{\text{RAS}}$ falls to the "L" level at the time t9, the identifying signal RBC is enabled. When the column address strobe signal $\overline{\text{CAS}}$ falls to the "L" level at the time t10, the RBC enable signal $\overline{\text{REFC}}$ is enabled. This causes the RBC trigger signal REFCT to be enabled.

Furthermore, when the row address strobe signal $\overline{\text{RAS}}$ attains the "H" level at the time t11, the identifying signal CBR is enabled and the identifying signal RBC is disabled. Additionally, the RBC enable signal $\overline{\text{REFC}}$ is disabled. When the column address strobe signal $\overline{\text{CAS}}$ attains the "H" level at the time t12, the identifying signal CBR is disabled. In addition, the RBC trigger signal REFCT is disabled.

In the test mode read cycle T2, since the CBR trigger signal REFAT and the WBR trigger signal REFBT both remains disabled, the test mode set signal $\overline{\text{TS}}$ and the test mode reset signal $\overline{\text{TR}}$ both remain unchanged. Therefore, the test mode enable signal $\overline{\text{TE}}$ also remains unchanged so that the dynamic RAM holds its test mode set state. At the time t13 when the test mode read cycle T2 terminates, the respective signals are at the same level as they took at the time t8 when the test mode set cycle T1 terminates.

When the dynamic RAM enters a writing cycle (test mode write cycle) during a test mode period, as indicated by dotted line in FIG. 6, the write enable signal $\overline{\text{WE}}$ falls to the "L" level at the time t29. Also in this case, the CBR trigger signal REFAT and the WBR trigger signal REFBT both remain disabled so that the test mode enable signal $\overline{\text{TE}}$ remains unchanged.

(3) Test mode hidden refresh cycle T3 (FIG. 7)

At the time t14, the row address strobe signal $\overline{\text{RAS}}$, the column address strobe signal $\overline{\text{CAS}}$ and the write enable signal $\overline{\text{WE}}$ are at the "H" level and the other signals are all at the same level as they took at the time t8 in FIG. 6. When the row address strobe signal $\overline{\text{RAS}}$ falls to the "L" level at the time t15, the identifying signal RBC is enabled. When the column address strobe signal $\overline{\text{CAS}}$ falls to the "L" level at the time t16, the RBC enable signal $\overline{\text{REFC}}$ is enabled by the RBCE circuit 21c. This causes the RBC trigger signal REFCT to be enabled. Since the write enable signal $\overline{\text{WE}}$ is held at the "H" level at the time t16, output data $D_{OUT}$ appear on the external output terminal 11.

When the row address strobe signal $\overline{\text{RAS}}$ attains the "H" level at the time t16, the identifying signal CBR is enabled and the identifying signal RBC is disabled. However, since the column address strobe signal $\overline{\text{CAS}}$ is held at the "L" level at this moment, the RBC trigger signal REFCT is held in its enabled state in the trigger signal generating circuit 31.

When the row address strobe signal $\overline{\text{RAS}}$ again falls to the "L" level at the time t18 so as to perform "hidden refresh", the CBR enable signal $\overline{\text{REFA}}$ is enabled. Since the RBC trigger signal REFCT has been enabled, however, the CBR trigger signal REFAT is held in its disabled state.

Since the identifying signal CBR and the CBR enable signal $\overline{\text{REFA}}$ have been enabled at this moment, as in the case of the refresh in normal mode, the row address buffer 2 receives address signals cXo through cXn-1 from the row address counter 2a to generate the internal row address signals aX0 through aXn-1. As a result, some memory cells in the memory cell array 1 are selected by these internal row address signal aX0 through aXn-1 so as to be refreshed. At this moment, the column address buffer 3, the column decoder 6, the pre-amplifiers 7a through 7d, the data out buffer 8 and the data in buffer 9 are made non-active by the CBR enable signal $\overline{\text{REFA}}$.

When the row address strobe signal $\overline{\text{RAS}}$ attains the "H" level at the time t19, the CBR enable signal $\overline{\text{REFA}}$ is disabled. When the column address strobe signal $\overline{\text{CAS}}$ attains the "H" level at the time t20, the RBC trigger signal REFCT is disabled. Since the CBR enable signal $\overline{\text{REFA}}$ has been already disabled at this moment, however, the CBR trigger signal REFAT is held in its disabled state. This causes high impedance in the external output terminal 11.

Furthermore, as indicated by dotted line in FIG. 7, when the column address strobe signal $\overline{\text{CAS}}$ attains the "H" level at the time t21 ahead of the row address strobe signal $\overline{\text{RAS}}$, the RBC trigger signal REFCT is disabled. However, since also the CBR enable signal $\overline{\text{REFA}}$ is disabled, the CBR trigger signal REFAT is held in its disabled state.

Through the above described operation, "hidden refresh" is performed during a test mode period. At the time t22 when the test mode hidden refresh cycle T3 terminates, the respective signals are at the same level as at the time t8 when the test mode set cycle T1 terminates.

As described above, since the test mode signal $\overline{\text{TS}}$ and the test mode reset signal $\overline{\text{TR}}$ do not change in level in the test mode hidden refresh cycle T3, also the test mode enable signal $\overline{\text{TE}}$ remains unchanged. Accordingly, even though "hidden refresh" is performed during the test mode period, the test mode cannot be cancelled.

(4) Test mode reset cycle T4 (FIG. 8)

At the time t23, the row address strobe signal $\overline{RAS}$, the column address strobe signal $\overline{CAS}$ and the write enable signal $\overline{WE}$ are at the "H" level, and the other respective signals are at the same level as at the time t8 in FIG. 6. When the column address strobe signal $\overline{CAS}$ falls to the "L[ level at the time t24, the identifying signal CBR is enabled. When the row address strobe signal $\overline{RAS}$ falls to the "L" level at the time t25, the CBR enable signal $\overline{REFA}$ is enabled. This causes the CBR trigger signal REFAT to be enabled. Therefore, input of the reset terminal N1 of the latch circuit L4 is enabled so that the latch circuit L4 is reset. As a result, the test mode reset signal $\overline{TR}$ is enabled. Accordingly, the latch circuit 14 is reset and the test mode enable signal $\overline{TE}$ is disabled.

When the column address strobe signal $\overline{CAS}$ attains the "H" level at the time t26, the identifying signal CBR is disabled. This causes the CBR enable signal $\overline{REFA}$ to be disabled. Furthermore, the identifying signal RBC is enabled. When the row address strobe signal $\overline{RAS}$ attains the "H" level at the time t27, the identifying signal RBC is disabled and the CBR trigger signal REFAT is also disabled.

Through the above described operation, reset of the test mode is performed. In other words, during a test mode period, the write enable signal $\overline{WE}$ is held at the "H" level and operation is performed at the timing of "$\overline{CAS}$ before $\overline{RAS}$" so that the test mode is reset. At the time t28 when the test mode reset cycle T4 terminates, the respective signals are at the same level as at the time t0 in normal mode.

As described above, there is provided a inhibiting circuit 22 in the dynamic RAM according to the embodiment above so that even though the "hidden refresh" operation is performed in a test mode period, the test mode cannot be cancelled. Accordingly, the test mode set and reset operations, the reading and writing operations during a test mode period and the "hidden refresh" operation during a test mode period are properly performed.

Meanwhile, structures of the respective circuits in the semiconductor memory device according to the present invention are not limited to the logical circuits as shown in the embodiments above, but any other structures which bring about similar effects are also applicable.

The operation shown in FIGS. 6 to 8 is one example. The operation according to the present invention is not limited to the operation shown in FIGS. 6 to 8.

As described in the foregoing, according to the present invention, test mode cancel is inhibited by a cancel inhibiting device in the case where a semiconductor memory device has been set in a predetermined operation mode during a test mode period, so that it is possible for the semiconductor memory device to perform the predetermined operation while holding the test mode during the test mode period.

Furthermore, it becomes possible for a semiconductor memory device which may be released from the test mode at the timing of so called "$\overline{CAS}$ before $\overline{RAS}$" to perform "hidden refresh" operation while maintaining the test mode. Therefore, the semiconductor memory device becomes easier to handle.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device selectively controllable for read and write operations in a normal mode and a test mode, comprising:
   control means responsive to at least one externally applied control signal for setting said semiconductor device in said test mode and for cancelling said test mode;
   means for setting said semiconductor memory device in a refresh operation state during said normal mode or said test mode;
   state hold means responsive to a read operation or write operation occurring before said refresh operation for being set in a predetermined state; and
   inhibiting means for inhibiting said control means from cancelling said test mode when said state hold means is in said predetermined state.

2. The semiconductor memory device according to claim 1, wherein said control means comprises:
   test mode enable means for generating a test mode enable signal which designates setting of said test mode.

3. The semiconductor memory device according to claim 2, wherein said state hold means comprises:
   first latch means for generating a first trigger signal which is applied to said inhibiting means,
   said first trigger signal being rendered at an active level when said first latch means has been set in said predetermined state, and being rendered at an inactive level when said predetermined state has been cancelled.

4. The semiconductor memory device according to claim 3, wherein
   said inhibiting means comprises:
   another state hold means for setting said test mode enable signal at an active level when said first trigger signal is at an active level.

5. The semiconductor memory device according to claim 1, wherein
   said control signal comprises a row address strobe signal, a column address strobe signal and a write enable signal,
   said control means provides for semiconductor memory operation in said normal mode if said row address strobe signal has been already at an active level at the moment when said column address strobe signal is rendered at an active level, and
   sets said semiconductor memory device in said test mode if said column address strobe signal and said write enable signal have been already rendered at an active level at the moment when said row address strobe signal is rendered at an active level, and cancels said predetermined operation mode when said row address strobe signal is rendered at an active level, and cancels said test mode if said column address strobe signal has been at an active level and said write enable signal has been at an inactive level at the moment when said row address strobe signal is rendered at an active level.

6. The semiconductor memory device according to claim 5, wherein
   said test mode comprises a hidden refresh mode in which:
   after said row address strobe signal is rendered at an active level, said column address strobe signal is rendered at an active level so that a reading operation is performed, and thereafter, said row address strobe signal is rendered at an inactive level while said column address strobe signal is at an active level, and again rendered at an active level after a predetermined time has passed thereby to perform a refresh operation.

7. The semiconductor memory device according to claim 5, wherein said control means comprises:

first enable signal generating means for generating a first enable signal if said column address strobe signal has been already at an active level at the moment when said row address strobe signal is rendered at an active level;

second enable signal generating means for generating a second enable signal if said write enable signal has been already at an active level at the moment when said row address strobe signal is rendered at an active level;

third enable signal generating means for generating a third enable signal if said row address strobe signal has been already at an active level at the moment when said column address strobe signal is rendered active;

set/reset signal generating means responsive to said first, second and third enable signals for generating a test mode set signal and a test mode reset signal; and another state hold means for generating a test mode enable signal which is rendered at an active level in response to said test mode set signal and rendered at an inactive level in response to said test mode reset signal, said state hold means comprises:

first latch means for generating first trigger signal which is rendered at an active level in response to said third enable signal and rendered at an inactive level in response to the fact that said row address strobe signal and said column address strobe signal and said column address strobe signal are rendered at an inactive level, and said inhibiting means holds said test mode resent signal at an inactive level which is to be generated from said set/reset signal generating means when said first trigger signal is at an active level.

8. The semiconductor memory device according to claim 7, wherein said inhibiting means comprises:

second latch means for generating a second trigger signal which is rendered at an active level in response to said first enable signal and rendered at an inactive level in response to the fact that said row address strobe signal has been rendered at an inactive level or the fact that said first trigger signal has been rendered at an active level; and third latch means for generating a third trigger signal which is rendered at an active level in response to the fact that said row address strobe signal has been rendered at an inactive level or the fact that said first trigger signal has been rendered at an active level, and said set/reset signal generating means comprises:

fourth latch means for rendering said test mode reset signal at an active level when said second trigger signal has been rendered at an active level, and for rendering said test mode set signal at an active level when said second trigger signal and said third trigger signal are rendered at an active level.

9. The semiconductor memory device according to claim 1, further comprising:

a memory cell array including a plurality of memory cells arranged in a plurality of rows and columns;

first selecting means for selecting any one of the plurality of rows in said memory cell array;

second selecting means for selecting any plurality of columns out of the plurality of columns in said memory cell array;

writing means for writing externally applied data in the memory cells selected by said first and second selecting means; and reading means for externally reading out data stored in the memory cells selected by said first and second selecting means.

10. The semiconductor memory device according to claim 9, further comprising:

test means for determining coincidence between the data read out of the memory cells which have been selected by said first and second selecting means in said test mode, and for externally outputting the results.

11. The semiconductor memory device according to claim 10, which further comprises sense amplifier means for amplifying data read out of the memory cells in the row which has been selected by said first selecting means, and wherein said test mode includes said refresh operation state, and in said refresh operation state, the data read out of the memory cells in the row which has been selected by said first selecting means are amplified by said sense amplifier means and the same amplified data are written into the memory cells in the same row again.

12. The semiconductor memory device according to claim 10, wherein in said test mode, externally applied data are written in said memory cell array by said writing means and, the written data are read out by said reading means and then coincide therebetween is determined by said test means to externally output the results.

13. A method of operating a semiconductor memory device selectively settable for in a predetermined operation in a normal mode and a test mode, wherein said semiconductor memory device comprises state hold means, comprising the following steps of:

latching a signal representing at least one of said normal mode and said test mode;

setting said semiconductor memory device in said normal mode or said test mode in response to an externally applied control signal;

setting said state hold means in response to setting said semiconductor memory device into said predetermined operation, and resetting said state hold means in response to cancelling said predetermined operation; and inhibiting cancelling of said test mode when said state hold means has been set.

14. An operating method of a semiconductor memory device which can be set in test mode and released from said test mode in response to the fact that a column address strobe signal has been at an active level at least at the moment when a row address strobe signal changes to an active level, comprising the following steps of:

performing reading operation by first setting said row address strobe signal at an active level and then said column address strobe signal at an active level; setting row address strobe signal at an inactive level while holding said column address strobe signal at an active level, setting again said row address strobe signal at an active level after a predetermined time has passed, and performing refresh operation while maintaining said test mode.

15. A semiconductor memory device capable of being set in a normal mode and a test mode by at least one of a plurality of externally applied signals, comprising:
- a first latch means responsive to a first sequence of said externally applied signals,
- a second latch means responsive to the output of said first latch means and the presence of said externally applied signals, for producing a signal corresponding to whether said test mode is currently set or not,
- third latch means responsive to said second latch means and at least one of said externally applied signals for producing at least a signal indicative of at least a predetermined condition of said externally applied control signals;
- timing means for altering the timing of a signal containing a change of state of the output of said third latch means, and
- fourth latch means responsive to said third latch means and said timing means for maintaining a predetermined output signal indicating whether said test mode is set or not.

16. A semiconductor memory device as recited in claim 15, wherein said third latch means further includes sequence detection means responsive to ones of said plurality of externally applied control signal for setting said semiconductor memory into said test mode and for cancelling said test mode.

17. A semiconductor memory device selectively operable in a normal mode and a test mode, comprising;
- a column address strobe before row address strobe enable circuit responsive to a row address strobe signal and a column address strobe signal for outputting a column address strobe before row address strobe enable signal,
- a write enable before row address strobe enable circuit responsive to the row address strobe signal and a write enable for outputting a write enable before row address strobe enable signal,
- a row address strobe before column address strobe enable circuit responsive to the row address strobe signal and column address strobe signal for outputting a row address strobe before column address strobe enable signal, and
- test mode control circuit responsive to said column address strobe before row address strobe enable signal, said write enable before row address strobe enable signal and said row address strobe before column address strobe enable signal for applying a test mode set signal and a test mode reset signal.

* * * * *